(12) United States Patent
Parker

(10) Patent No.: US 6,452,410 B1
(45) Date of Patent: Sep. 17, 2002

(54) APPARATUS AND METHOD FOR ELECTROLYTIC BARE BOARD TESTING

(75) Inventor: Kenneth P Parker, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/478,027

(22) Filed: Jan. 5, 2000

(51) Int. Cl.$^7$ ................................................ G01R 31/02
(52) U.S. Cl. ...................................................... 324/762
(58) Field of Search ................................. 324/754, 761, 324/762, 765, 500, 537, 694, 530; 205/791

(56) References Cited

U.S. PATENT DOCUMENTS

| | | | |
|---|---|---|---|
| 4,165,270 A | * 8/1979 | Ost et al. | 204/195 R |
| 4,379,992 A | 4/1983 | Geisel | 324/158 F |
| 4,427,496 A | * 1/1984 | Katz | 205/791 |
| 4,662,975 A | * 5/1987 | Dufresne et al. | 324/437 |
| 4,939,469 A | * 7/1990 | Ludwig et al. | 324/694 |
| 5,268,645 A | * 12/1993 | Prokoff et al. | 324/537 |

\* cited by examiner

Primary Examiner—Vinh P. Nguyen
(74) Attorney, Agent, or Firm—Kyle J. Way

(57) ABSTRACT

An electrolyte is employed to test for defects in bare printed circuit boards. A bare board under test is placed in a conductive tank and immersed in an electrolyte. A probe is then used to contact a pad of a net to be tested on the board. The electrical resistance is then measured across the net and the electrolyte, the magnitude of the resistance being related to the number of pads actually connected to the net. The measurement thus provides an indication of whether the correct number of pads have been detected. Defects on the board, such as unintended short circuits and open circuits, cause the number of pads detected to be different from the expected value, thereby affecting the measured resistance.

8 Claims, 8 Drawing Sheets

APPARATUS AND METHOD FOR ELECTROLYTIC BARE BOARD TESTING

FIELD OF THE INVENTION

The present invention relates, in general, to printed circuit board testing, and, more particularly, to the testing of bare printed circuit boards by the use of an electrolyte.

BACKGROUND OF THE INVENTION

Printed circuit boards, or "PCBs," have been used in the electronics industry for many years as a valuable means of connecting many separate electronic components, such as integrated circuits ("ICs"), resistors, capacitors, and others, to form an electronic circuit necessary to perform a desired function.

Conductive connection points on the boards, called "pads," are the areas of the board to which the various electronic components are connected. The pads are, in turn, connected to each other with printed wiring to form "nets" so that there are essentially zero ohms of impedance between any two pads on the net. Conversely, two pads on different nets essentially have an infinite amount of impedance between them.

To further define some terminology, a "layer," as it relates to printed circuit boards, is a collection of pads and associated printed wiring that substantially reside within the same geometric plane. A PCB has one or more such layers, with each layer being isolated from the next by a stratum of nonconductive material. Many PCBs have two or more layers, and some will have several, with only the outermost layer on each side of the board having pads. Some of the layers may even be power or ground distribution "planes," with those layers consisting mostly of metal, as opposed to a small amount of printed wiring. Portions of a net may reside on several different layers, with "vias," or plated-through holes, connecting those portions to form the net.

For descriptive purposes, FIG. 1 presents an edge view of an example of a 2-layer printed circuit board 1, and FIG. 2 provides a plan view of the top of board 1. The conductive portion of board 1 consists primarily of layers 7 and 8, with the layers being separated by nonconductive material 9. Printed wires 2 connect solder pads 3 to each other to form nets 4. Via 5 is utilized on this board to connect two portions of a net 4 that are on opposite sides of board 1. For purposes of illustration, the height of layers 7 and 8, as shown in FIG. 1, is greatly exaggerated compared to the thickness of nonconductive material 9.

Prior to attaching electronic components to the PCB, a solder "mask," or protective layer, is usually applied to the two sides of the board. As shown in FIG. 3, solder mask 6 covers printed wiring 2 (FIG. 1), vias 5 (FIG. 1), and other areas of the board, essentially leaving only connective pads 3 exposed. Solder mask 6 serves to prevent solder from adhering to unwanted areas of the board, as well as to protect the board from damage due to abrasion or corrosion.

In order to guarantee a certain level of quality in the products that incorporate such boards, the PCBs are usually tested alone prior to being assembled with the rest of the product in which they reside. At least some of this testing is performed after the boards have been populated with electronic components.

Over the years, printed circuit board technology has progressed. More specifically, the number of layers allowed has increased, while the distance between printed wires, and the width of the wires themselves, have decreased. As a result, the number of components that can be attached to a given amount of surface area on a board has increased substantially. At the same time, the electronic components that populate these boards have become more complex, due to advances in IC technology. Therefore, it is now common for the overall cost of a board populated with electronic components to be determined primarily by the cost of the individual components rather than by the cost of the "bare," or unpopulated, board.

A direct result of these advances is that testing the bare board before attaching the electronic components is essential, since the discovery of a board defect after populating the board may now result in a much greater cost than if the defect were found prior to attaching the components. The two most common defects are "short circuits," whereby two nets that are intended to be separate are, in fact, connected, and "open circuits," whereby a portion of a net is inadvertently disconnected from the remainder of the net. In the case that such defects are discovered during testing, the bare board is typically discarded, since repairing the board is generally not economically feasible.

Currently, two basic methods exist for testing bare boards. In the first case, a test fixture is constructed which contains a contact probe for each pad on the board. For boards with pads on each side (called "two-sided boards"), the fixture has two sides and is capable of contacting all of the pads on both sides. Each contact probe is connected in some fashion to a test algorithm controller, which checks for wanted or unwanted electrical continuity between any two probes, thereby checking for any of the short circuit or open circuit board defects mentioned above. Tests can be performed quickly using such a system, but a new test fixture must be manufactured for each board design to be tested. Any changes in the board require commensurate changes in the test fixture. Also, test fixtures for the more complex board designs may require tens of thousands of probes, making such fixtures expensive, fragile, and difficult to modify.

The second method involves a "flying probe" technique, whereby two or more probes-are mechanically maneuvered over, and possibly under, the board under test by a probe movement mechanism. Two or more pads are contacted at a time, and a continuity measurement is made. Due to the need to move the probes horizontally over the board for each measurement, this method will be inherently slower that the first method described. On the other hand, using the flying probe method is generally much less expensive, because little "fixturing," or modification of the tester specific to the board under test, is required, and design changes to the board under test are easily accommodated by changes to the test algorithm controller software.

One major drawback of both techniques discussed above is that the continuity of each pad is tested with respect to every other pad on the board to guarantee that no unintended short circuits or open circuits exist. Testing of each pad on each net in this manner is typically a time-consuming and relatively expensive process. Therefore, a need currently exists for a method of bare board testing that can measure each net without requiring the probing of each pad on a net, or pads on other, unrelated nets.

SUMMARY OF THE INVENTION

In the embodiments discussed below, the invention provides a way to test a bare printed circuit board without probing every possible pad combination, saving both time and expense during testing. The associated test fixture necessary to implement an embodiment of the invention is simple to manufacture, and easy to modify in response to board design changes.

One embodiment of the bare board tester according to the invention includes a conductive tank, together with a way to support the bare board within the tank. Contained within the tank is a sufficient amount of an electrolyte to immerse the board. One or more probes are then used to contact the pads of the board. The probes are used to measure the electrical resistance between the probe and the conductive tank. In some embodiments, this measurement is performed by applying a voltage across one of the probes and the tank, thereby generating an electrical current through the pad being contacted by the probe, the net to which the probe is attached, and the electrolyte. The amount of current is indicative of the resistance encountered, which, in turn, indicates the total surface area of that net that is exposed to the electrolyte. If the printed circuit board includes a solder mask that leaves only the connection pads exposed, and the pads are all essentially the same size, then the measured resistance is directly related to the number of pads connected to the net being tested. In such an embodiment, a means to measure this current is provided to determine if the net is connected to the proper number of exposed pads. therefore, only one pad per net is required to be in contact with a probe to determine if the corresponding net is intact.

In an example embodiment of the tester according to the present invention, the probing mechanism used is one or more X-Y flying probes, moved about the board, and contacting one pad at a time from each net in sequence. In another embodiment, the probe is one of several fixture probes, whereby one probe for each net exists. The fixture probes are thus stationary, with one probe being used at a time in sequence to perform the test on each net.

In yet another embodiment, the tester includes a method for preventing the formation of gas bubbles in the electrolyte, which would tend to reduce the surface area of the pads that are in contact with the electrolyte. For example, the electrolyte may be stirred or agitated to serve that purpose.

The invention also is embodied in a method of immersing a bare printed circuit board in an electrolyte and measuring the resistance across a net under test and the electrolyte to detect the presence of unintended short or open circuits. Defective nets can be detected by comparing the resistance value associated with a net with a predetermined theoretical resistance value for that same net. Alternately, that decision can be made by comparing the measured resistance related to each net with that of other nets, since the ratio of any two measured resistances will be consistent regardless of factors such as ionic concentration in the electrolyte and the resistance measurement circuitry used.

Other aspects and advantages of the invention will become apparent from the following detailed description, taken in conjunction with the accompanying drawings, illustrating by way of example the principles of the invention.

DETAILED DESCRIPTION

Figure 4:
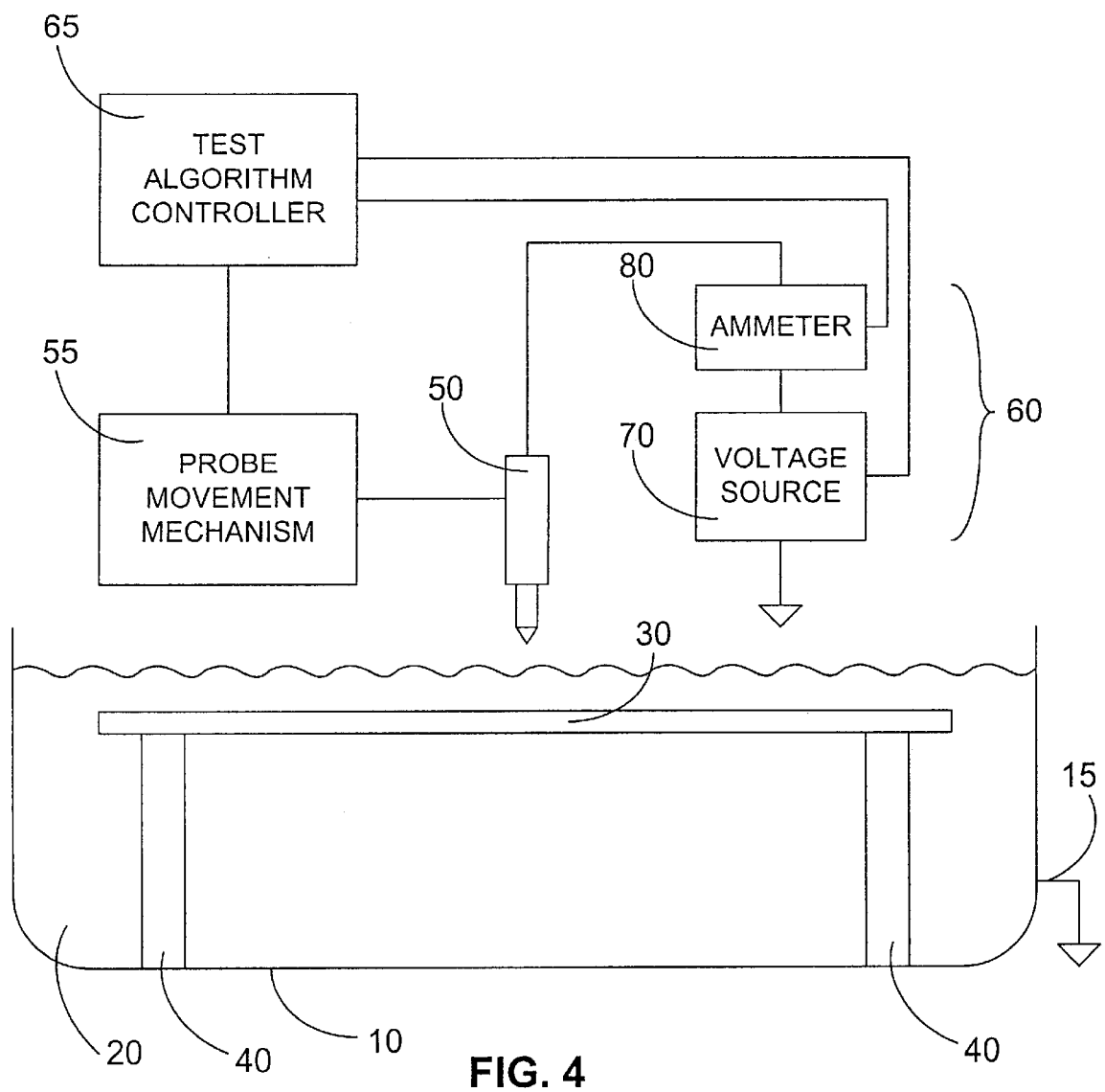
FIG. 4 is a block diagram of a flying probe embodiment of the invention utilizing a conductive tank.

In the embodiment shown in FIG. 4, a conductive tank 10 contains an electrolyte 20. Conductive tank 10 is connected to voltage reference 15, which, in the embodiment of FIG. 4, is ground. A bare printed circuit board 30 to be tested is supported within conductive tank 10 by board supports 40 in such a manner that the board is immersed by electrolyte 20 and that none of the board pads are in direct contact with conductive tank 10.

Use of conductive tank 10, as compared to the use of a single electrode within a nonconductive tank, reduces the resistance between electrolyte 20 and tank 10 to a negligible level, thereby making the resistance across the net-to-electrolyte boundary the dominant portion of the resistance measured by the tester. In such a test system, the resistance of the electrolyte alone is also much less than that measured across the net-to-electrolyte boundary, regardless of the distance measured across the electrolyte.

The chemistry of electrolyte 20 is such that it provides an easily measurable resistance across the net-to-electrolyte boundary. Electrolyte 20 also is compatible with and non-corrosive to the pads of printed circuit board 30, as well as to the surface of conductive tank 10. More specifically, to prevent any significant plating of board 30 or tank 10, the resulting electrical current from the test is low, such as on the order of several milliamperes or microamperes, indicating that a fairly high, yet still measurable, resistance is being measured. Furthermore, considering that the measurement of a net generally requires no more than a few hundred microseconds, plating of tank 10 and board 30 is negligible. (Information on electroplating and how it relates to electrical current can be found, for example, in *Printed Circuits Handbook* (4$^{th}$ Edition) by Clyde F. Coombs, Jr. Such information is well known, and can be found in a number of other sources, as well.) It is also useful for electrolyte 20 to be of such a consistency as to be easily washable from the surface of board 30 after the entire board test has been completed, and that ultimate disposal of electrolyte 20 should not create a health or environmental hazard. As a result, the choice of electrolyte 20 is dependent upon the particular materials and enviromnental conditions involved with a given PCB and test system, and is readily determined from prior art.

In the embodiment of FIG. 4, a "flying" X-Y probe 50 is used to make contact with the pads of printed circuit board 30. A probe of this type is used in other types of printed circuit board testers, and is well known in the art. Probe 50 can be moved horizontally in the X and Y directions to position the tip of probe 50 directly over a pad with which an electrical connection is to be made. Probe 50 also moves vertically in the Z direction to make contact with a pad for performing a continuity measurement, or to raise probe 50 prior to moving to a new pad location. Movement of the probe is accomplished by a probe movement mechanism 55 attached to the probe. Probe movement mechanism 55 is also well known in the art. Additionally, the shaft of probe 50 is insulated, leaving only the tip exposed to electrolyte 20. The insulation is necessary since superfluous surface area of probe 50 in contact with electrolyte 20 affects the electrical measurements being made.

Also in FIG. 4, a measurement mechanism 60 is connected between probe 50 and reference voltage 15 of conductive tank 10. Measurement mechanism 60, in this case, contains a voltage source 70 and an ammeter 80. Voltage source 70 supplies a predetermined voltage to the circuit while probe 50 is connected to a pad of a net on board 30. Ammeter 80 measures the current resulting from the supplied voltage in order to determine if any unintended shorts or breaks in the net are present.

Attached to movement mechanism 55 and measurement mechanism 60 is a test algorithm controller 65, which essentially controls the probe movement, resistance measurement, and data collection and interpretation capabilities of the system, and is well known in the art. For example, algorithm controller 65 may be, but is not limited to, a personal computer or a microprocessor-based embedded control system.

Figure 5:
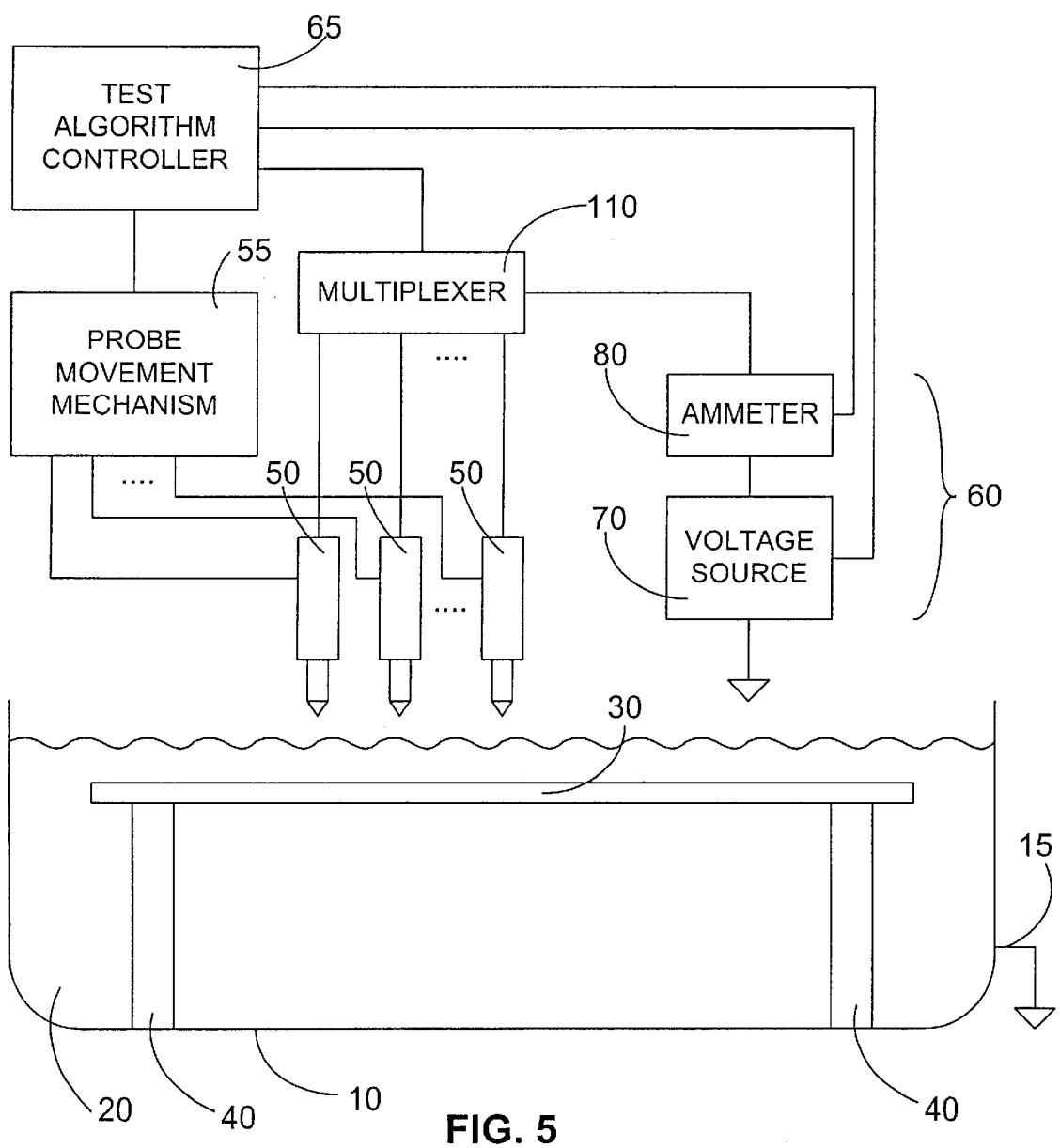
FIG. 5 is a block diagram of an embodiment of the invention employing multiple flying probes.

As a modification of the embodiment shown in FIG. 4, FIG. 5 shows the use of two or more X-Y probes 50. The advantage provided by this embodiment is that more than one measurement can be performed serially in between movements of X-Y probes 50, thereby reducing overall test time. The measurements using multiple probes must be performed using only one probe at any time in order to measure the resistance associated with any net accurately. The probe 50 in use for a particular measurement is connected to measurement mechanism 60 by way of multiplexer 110. Test algorithm controller 65 controls the actions of multiplexer 65, as well as measurement mechanism 60 and probe movement mechanism 55.

Figure 6:
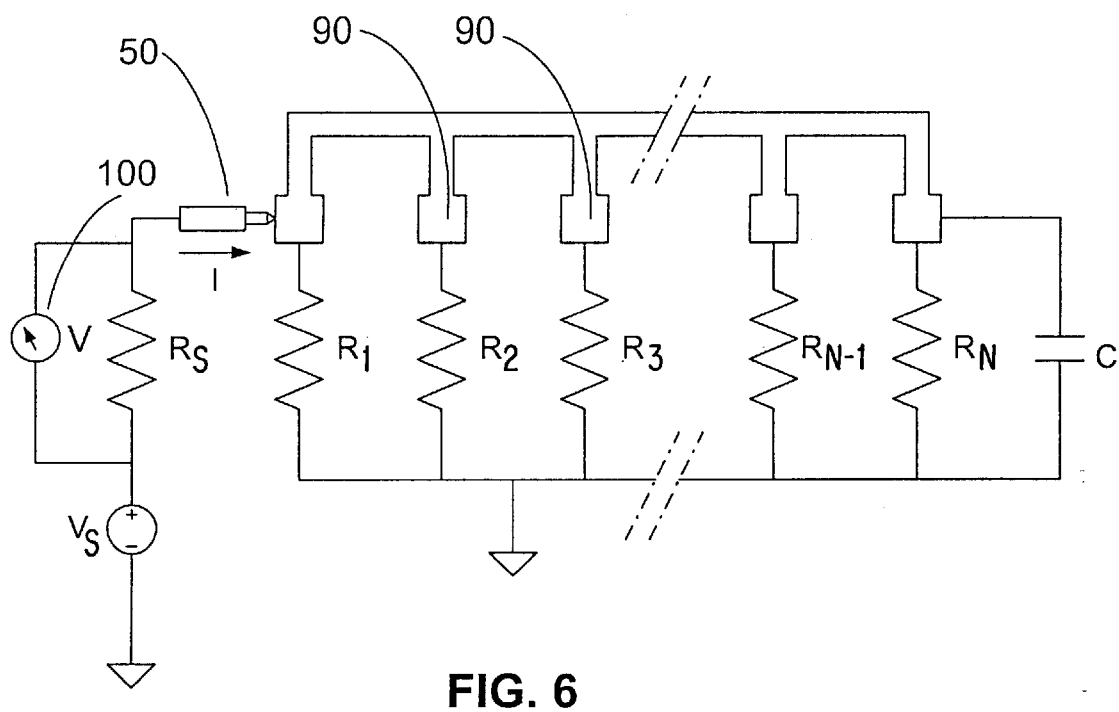
FIG. 6 is an electrical schematic representation of the embodiment of FIG. 4 for the testing of a defect-free net.

FIG. 6 is an electrical schematic representation of the circuit formed by the embodiment of the invention shown in FIG. 4. In the general case, the net being tested is assumed to have N pads 90. For the sake of discussion, it is also assumed in the foregoing examples that substantially all of the printed wiring connecting pads 90 are covered by a solder mask, and that all of the pads 90 have essentially the same surface area. For any bare circuit board (with or without a solder mask) to be tested, the total surface area of a net under test that is exposed to the electrolyte must be determined in order to ascertain an expected amount of resistance exhibited by the net-to-electrolyte boundary.

As can be seen in FIG. 6, the measurement system can be looked upon as having a voltage source $V_S$, and a source resistance $R_S$ in parallel with voltmeter 100, with these last two components making up ammeter 80 of FIG. 4. Also, a stray capacitance C exists between pads 90 and conductive tank 10 of FIG. 4. Under DC (direct current) steady state conditions, however, capacitance C need not be considered if the current measurement is taken after the appropriate settling time, which can be calculated from the time constant defined by source resistance $R_S$ and stray capacitance C. This time constant may be kept low by increasing the distance between the tank and the board to reduce the magnitude of stray capacitance C.

Figure 1:
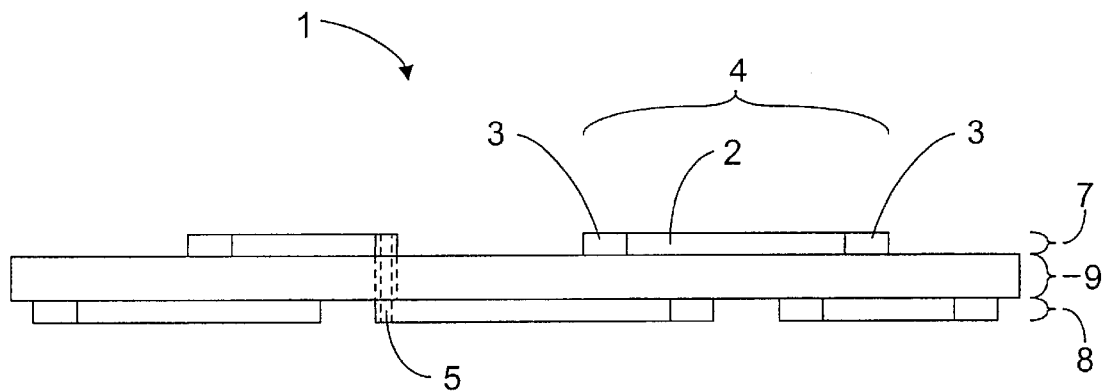
FIG. 1 is an edge view of a 2-layer bare printed circuit board before application of a solder mask.
Figure 2:
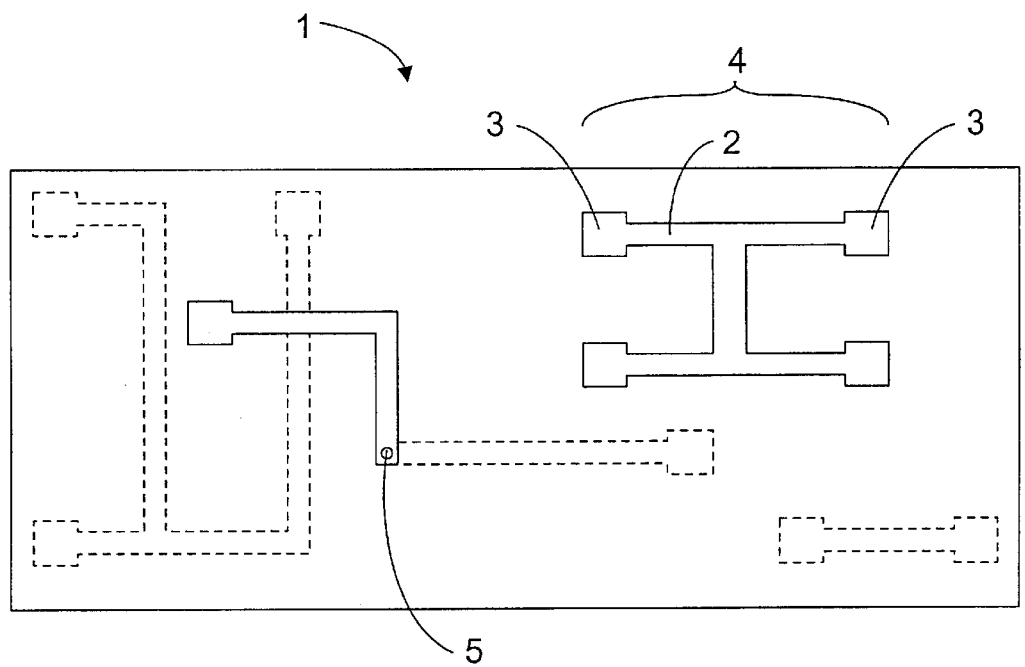
FIG. 2 is a plan view of the top surface of the bare printed circuit board of FIG. 1.
Figure 3:
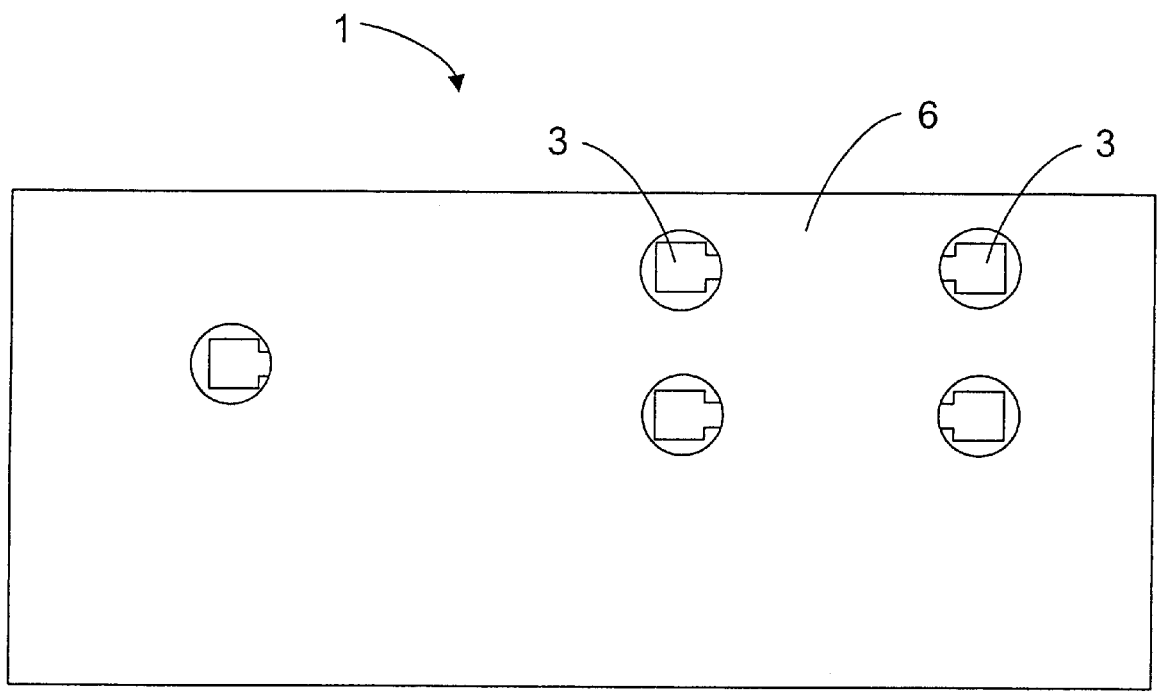
FIG. 3 is a plan view of the bare printed circuit board of FIG. 1, with the solder mask applied.

Also in FIG. 6, it is assumed that each pad 90 possesses essentially the same surface area to be exposed to the electrolyte. As a result, the electrical path from each pad 90 to conductive tank 10 will be substantially the same so that essentially equivalent resistance values will be present from each pad 90 to conductive tank 10 (FIG. 3). Stated in another way:

$$R_1=R_2=R_3= \ldots =R_{N-1}=R_N=R$$

The overall resistance across the net being measured and the electrolyte, then, is the parallel combination of N resistances of value R:

$$R_{NET}=R/N$$

The determination of the value of RNET can be made through theoretical determination using the proper number of pads for each net, or through empirical data from measurements taken on a known good board.

According to the circuit of FIG. 6, under steady state conditions, the voltage V measured by voltmeter 100 will be as follows:

$$V=V_S*R_S/(R_S+(R/N))$$

Voltage V, in turn, corresponds to the current I through source resistance RS as follows:

$$I=V/R_S=V_S/(R_S+(R/N))$$

The total resistance of the net being measured and the electrolyte is thus measured by way of the source voltage applied and the current measured:

$$R_{NET}=R/N=(V_S/I)-R_S$$

Figure 7:
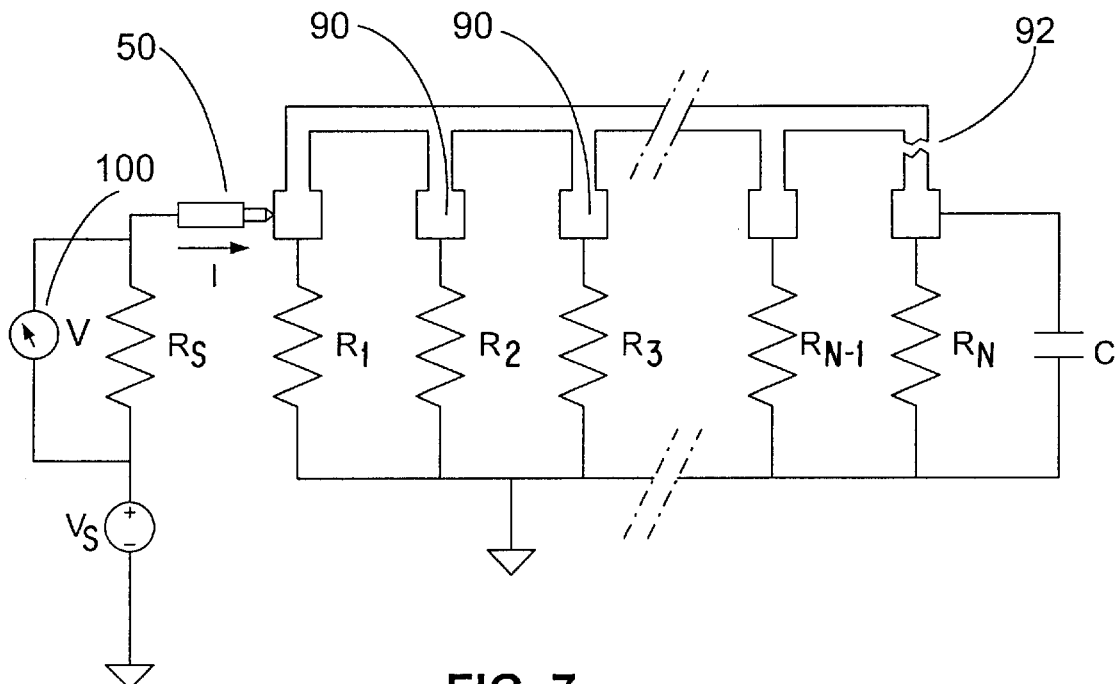
FIG. 7 is an electrical schematic representation of the embodiment of FIG. 4 for the testing of a net which contains an open circuit at one of the non-probed pads of the net.
Figure 8:
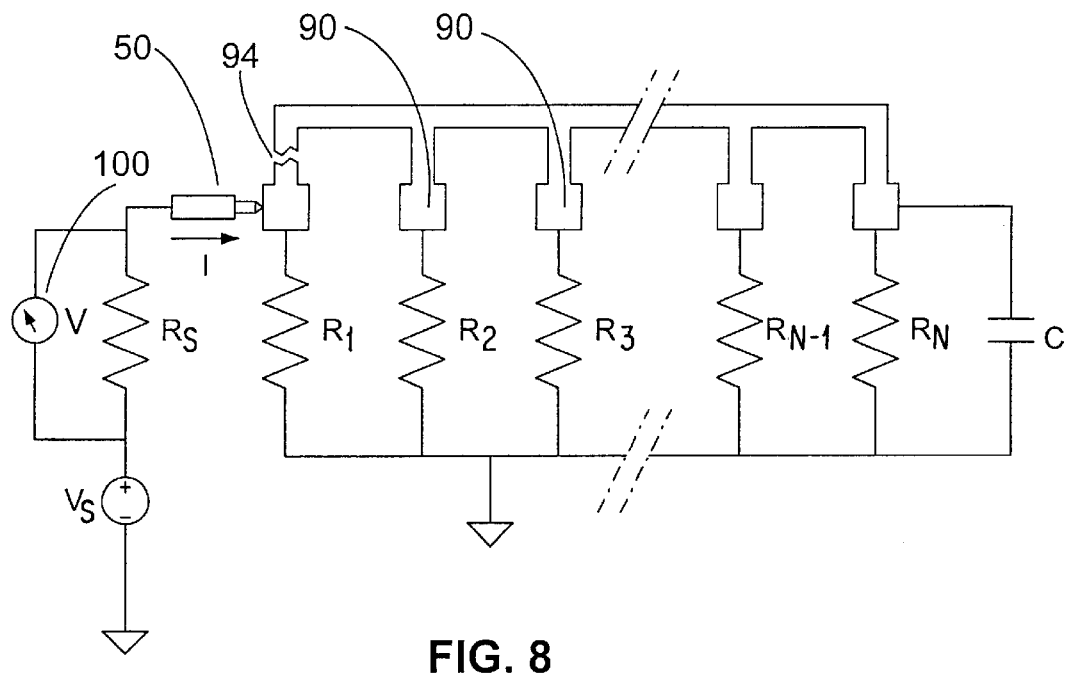
FIG. 8 is an electrical schematic representation of the embodiment of FIG. 4 for the testing of a net which contains an open circuit at the probed pad of the net.

Note that changes in value N cause a corresponding change in voltage V and current I. Changes in N result, for example, when unintended breaks in the net under test occur. FIG. 7 shows the case of an open circuit 92 resulting in a disconnected pad that is not the pad being directly probed by probe 50 (from FIG. 4). In that case, N is reduced to N−1, resulting in a different voltage V than what would be observed with the same net on a defect-free board. In the case of FIG. 8, where an open circuit 94 results in the pad being directly probed becoming disconnected, N will be reduced to the value 1, again resulting in voltage V being different from what would be normally expected for that net.

Figure 9:
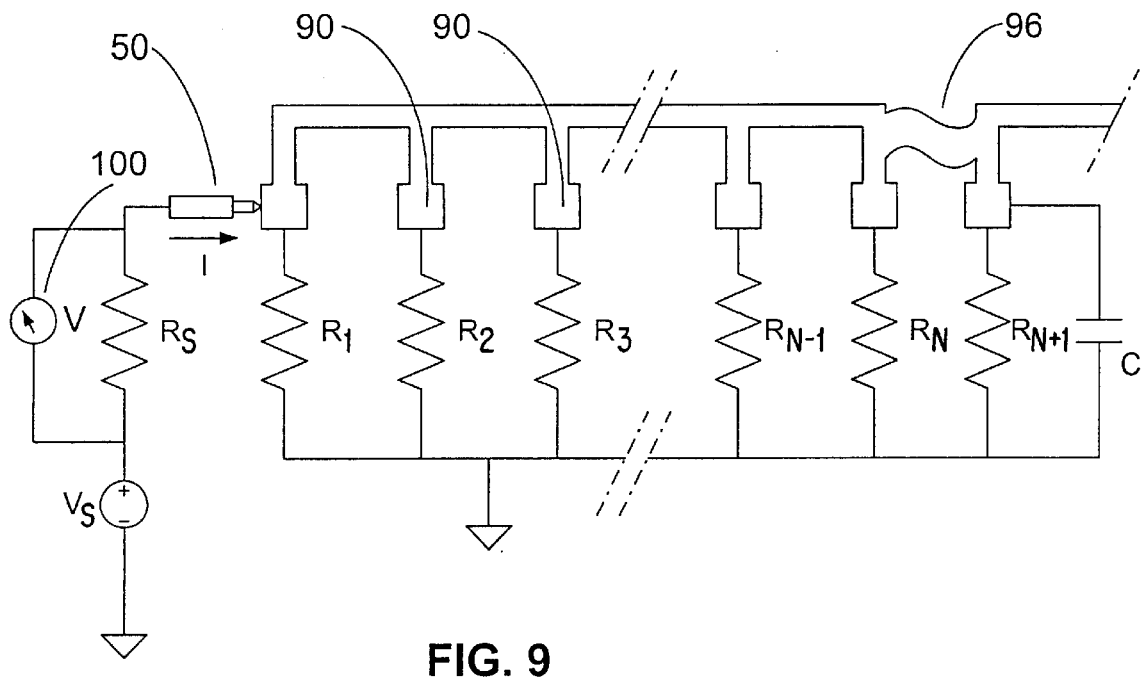
FIG. 9 is an electrical schematic representation of the embodiment of FIG. 4 for the testing of a net that is shorted to another net on the board.

As depicted in FIG. 9, changes in N also occur when the net under test is inadvertently connected by a short circuit 96 to another net on the board. The number of exposed pads that are connected to the net under test will increase, thereby increasing the value for N, which, in turn, increases voltage V beyond what would normally be expected for that net.

One important point is that a combination of short circuits and open circuits may cause the apparent value of N to be the same as a defect-free net. Errors of exactly this type are generally not detectable by the embodiments proposed by this invention without measurement information from other nets on the board. However, board defects of this exact type are quite rare. Also, since such a defect requires a short to another net on the board, the defect will most likely be detected when the net "shorted to" is tested.

Figure 10:
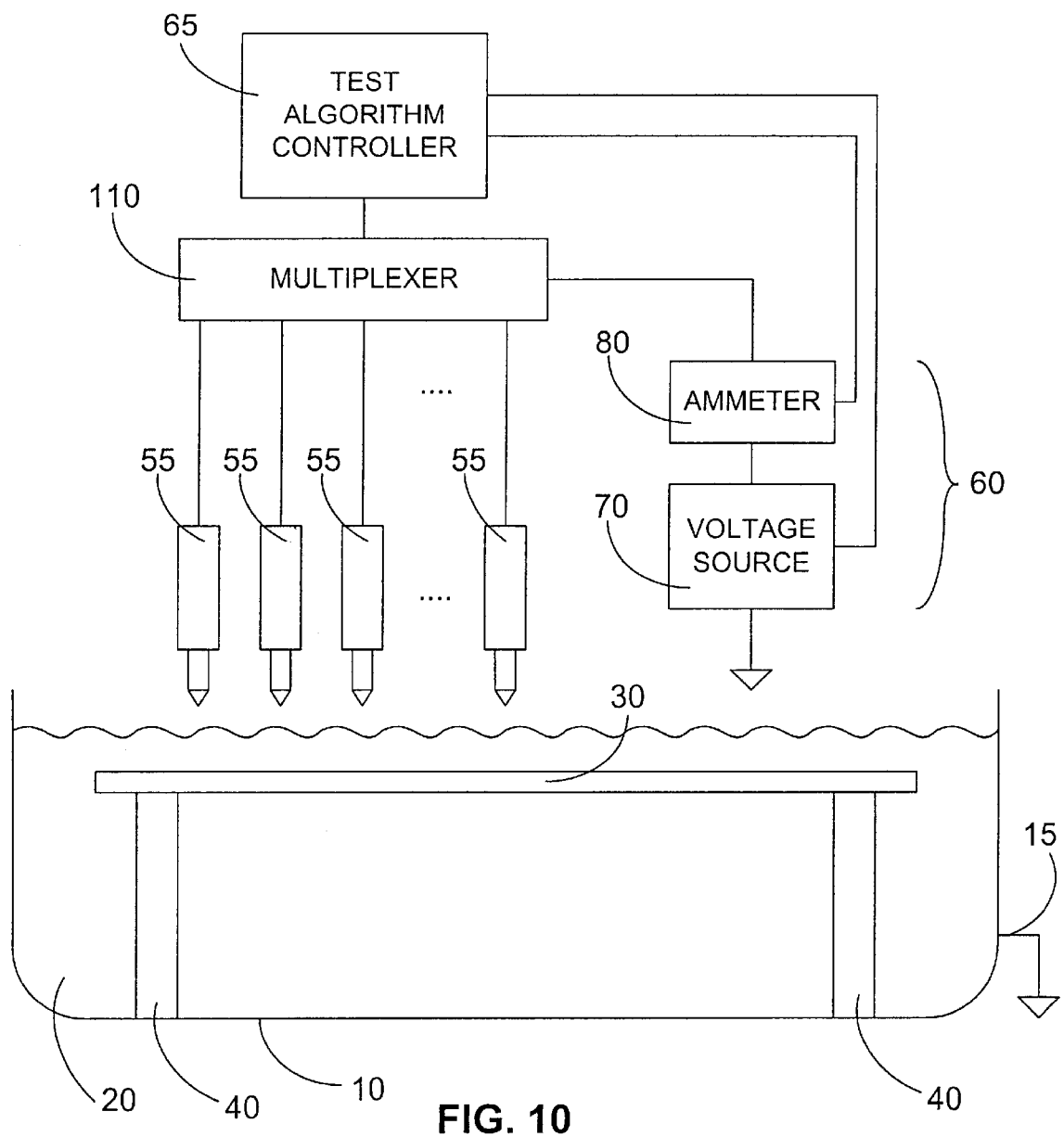
FIG. 10 is an embodiment of the invention utilizing multiple stationary probes.

In another possible embodiment, as shown in FIG. 10, flying X-Y probe 50 of FIG. 4 is replaced by a set of stationary fixture probes 55. In this embodiment, the time required for the movement of flying probe 50 is eliminated. A tester using stationary fixture probes 55 is more difficult and time-consuming to manufacture than one using flying probe 50, but is less expensive than normal bare board test fixtures, since only one fixture probe 55 is necessary for each net on the board.

Most current probe fixtures require a probe for each pad. Care must be taken so that each of fixture probes 55 has an insulated shaft, as is the case with flying probe 50, or by ensuring in some other manner that only the tips of fixture probes 55 make contact with electrolyte 20. In this system, each fixture probe 55 is connected, one at a time, to measurement mechanism 60 with multiplexer 110, in a fashion similar to the embodiment of FIG. 5.

As is evident with respect to all of the above-mentioned embodiments, a board with pads on both sides of the board may require a separate test for each side if there are nets on both sides which are accessible from only one side of the board.

Figure 11:
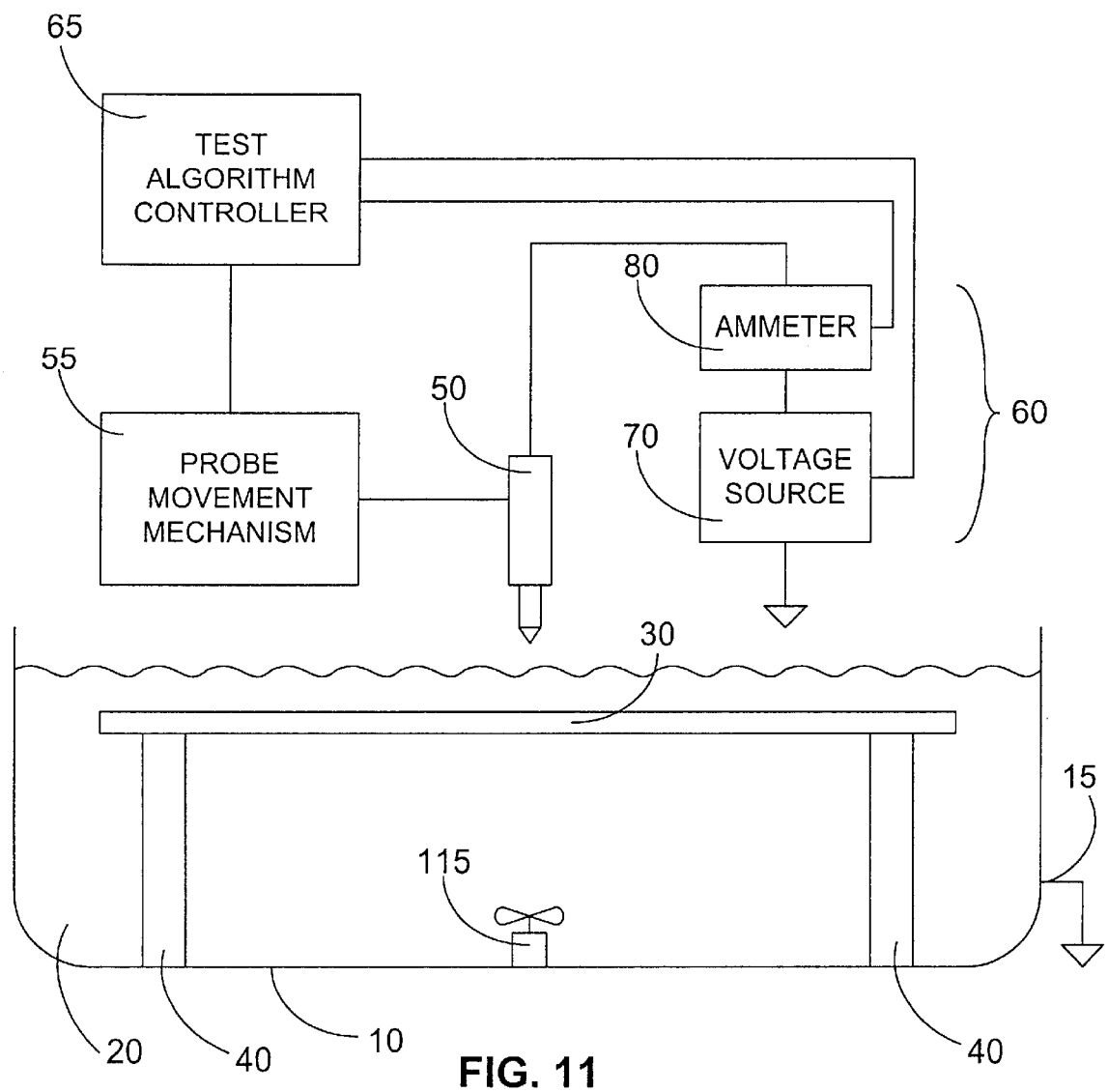
FIG. 11 is an embodiment of the invention that includes a stirring or agitating mechanism for the electrolyte.

In yet another embodiment, either of the two previous embodiments can be augmented with a means of agitating or stirring the electrolyte, as shown, for example, by agitator 115 in FIG. 11, using the embodiment of FIG. 4 as an example. Adding such a means will help prevent uneven concentrations of ions in the electrolyte, and aid in the prevention of the formation of gas bubbles that could possibly reduce the surface area of the pads in contact with the electrolyte, which could adversely affect the repeatability of the test measurements.

The present invention may also be implemented as a method of testing a bare printed circuit board by use of an electrolyte. The method involves immersing a bare printed circuit board to be tested in an electrolyte, measuring the electrical resistance separately through each net and the electrolyte, and deciding which nets contain an unintended short circuit or open circuit.

The deciding step can be undertaken at least two different ways. For example, the resistance for each net can be compared with a theoretical resistance value that is based on the number of exposed pads on the net, as shown in the equations above. The nets possessing resistance values outside of a predetermined range around the theoretical resistance value can then be designated as defective. Alternatively, the measured resistance of the same net on a known good board could also be used for comparison purposes. Such a technique is valid if, for example, the ionic concentration of the electrolyte is maintained, and the technique of measuring the electrical resistance of each net is consistent, during the testing of all boards.

In another case, if the electrolyte ionic concentration cannot be maintained within reasonable limits, or other variations occur in the test system from board to board that affect the magnitude of the resistances being measure, another implementation of the deciding step can be utilized. Regardless of the ionic concentration or other influencing factors, the ratios of resistance levels between various nets on a known good board would be consistent. Thus, the relative resistance levels of all of the nets on the board can be compared to each other. Those nets possessing resistance levels outside of a predetermined range when compared in ratio to the resistance levels of other nets can then be considered defective. For example, a net with 2 pads on a solder masked PCB should exhibit twice the resistance of a net with 4 pads; if the measurements performed on these nets do not substantially exhibit that ratio, one of the two nets must be defective.

From the foregoing, it will be apparent that the invention provides a simple and effective method and apparatus for testing unpopulated printed circuit boards. Electrolytic bare board testing according to the invention can be performed without requiring the probing of every pad on the board.

What is claimed is:

1. A tester for bare printed circuit boards, comprising:

a conductive tank large enough to hold a printed circuit board therein;

at least one board support that retains the board within the tank so that the board is not in direct contact with the tank;

an electrolyte contained in the tank and of sufficient depth to immerse the board;

at least one probe, with a tip that contacts the exposed pads of the board, wherein only the tip of the probe is exposed to the electrolyte;

a measurement mechanism that measures the electrical resistance between each of the probes and the conductive tank; and a test algorithm controller, connected to the measurement mechanism.

2. The tester of claim 1, wherein the measurement mechanism further comprises:

a voltage source that applies a voltage difference via each of the probes across a pad of a net under test on the board, and the tank; and an ammeter that determines the magnitude of electrical current through each of the probes resulting from the voltage difference being applied by the voltage source.

3. The tester of claim 1, further comprising:

a probe movement mechanism, connected to the probe and the test algorithm controller, which has the ability to move the probe into contact with each of the pads of the board, wherein the probe is a single flying X-Y probe.

4. The tester of claim 1, further comprising:

a probe movement mechanism, connected to the probes and the test algorithm controller, that is able to move the probes into contact with the exposed pads of the board, wherein the probes are a plurality of flying X-Y probes; and a multiplexer, controlled by the test algorithm controller, to connect each of the probes to the measurement mechanism.

5. The tester of claim 1, further comprising:

a multiplexer, controlled by the test algorithm controller, to connect each of the probes to the measurement mechanism, wherein the probes are a plurality of fixture probes.

6. The tester of claim 1, further comprising means for preventing the formation of gas bubbles in the electrolyte.

7. The tester of claim 6, wherein the preventing means consists of an agitating mechanism.

8. The tester of claim 6, wherein the preventing means consists of a stirring mechanism.

\* \* \* \* \*